United States Patent [19]

Westermeier

[11] Patent Number: 4,672,736

[45] Date of Patent: Jun. 16, 1987

[54] METHOD FOR PRODUCING LASER DIODES WITH AN ADJUSTED AND INTEGRATED HEAT SINK

[75] Inventor: Heinz Westermeier, Neubiberg, Fed. Rep. of Germany

[73] Assignee: Siemens Aktiengesellschaft, Berlin and Munich, Fed. Rep. of Germany

[21] Appl. No.: 766,540

[22] Filed: Aug. 19, 1985

[30] Foreign Application Priority Data

Sep. 26, 1984 [DE] Fed. Rep. of Germany ....... 3435306

[51] Int. Cl.⁴ .................. H01L 21/302; H01L 21/461; B01J 17/00
[52] U.S. Cl. .................................... 29/569 L; 29/580; 29/583; 29/591; 148/1.5; 372/36
[58] Field of Search ...................... 29/569 L, 580, 582, 29/583, 591; 148/1.5; 372/36

[56] References Cited

U.S. PATENT DOCUMENTS

| | | | |
|---|---|---|---|
| 4,073,055 | 2/1978 | Kimura et al. | 29/583 |
| 4,197,631 | 4/1980 | Meyer et al. | 29/574 |
| 4,224,734 | 9/1980 | Tiefert et al. | 29/583 |
| 4,236,296 | 12/1980 | Woolhouse | 29/569 L |
| 4,259,682 | 3/1981 | Gamo | 357/55 |
| 4,306,351 | 12/1981 | Ohsaka et al. | 29/569 |
| 4,525,924 | 7/1985 | Schäfer | 29/580 |
| 4,542,512 | 9/1985 | Van Den Beemt | 372/36 |
| 4,546,478 | 10/1985 | Shimizu et al. | 372/36 |

Primary Examiner—Upendra Roy
Attorney, Agent, or Firm—Hill, Van Santen, Steadman & Simpson

[57] ABSTRACT

For adjustment of heat sinks to be applied to a wafer being used to form a plurality of semiconductor diodes, a mask is applied to the wafer. Openings of the mask are offset in rows relative to one another for the electrolytic deposition of the material of the heat sinks such that optimum exploitation of the wafer surface is achieved. Sufficient space remains for placement of scoring lines on the wafer surface to facilitate breaking of the wafer first into individual ingots, and then into separate laser diodes. End faces of the heat sinks are arranged close to minor faces of the diodes by appropriate placement of the scoring lines.

9 Claims, 2 Drawing Figures

METHOD FOR PRODUCING LASER DIODES WITH AN ADJUSTED AND INTEGRATED HEAT SINK

BACKGROUND OF THE INVENTION

The present invention relates to a laser diode having an integrated heat sink wherein the heat sink is a body of material having good thermal conductivity which is applied to a semiconductor body close to a laser-active zone and close to resonator mirrors thereof.

It is known to manufacture laser diodes as single components which respectively comprise a heat sink of material having good thermal conductivity, usually metal. In particular, strip laser diodes and "buried layer" laser diodes have a semiconductor body which preferably comprises a plurality of epitaxy layers, particularly a hetero-layer structure. Such a multi-layer structure is manufactured by epitaxial deposition on a substrate member. The actual laser-active zone is situated in a layer which lies close to a surface of the hetero-layer structure and opposite the substrate. In a laser diode having such a structure, the heat necessarily arising in the generation of the laser radiation is consequently generated close to this surface of the layer structure facing away from the substrate. It is therefore meaningful to apply the heat sink on this surface of the layer structure. This is referred to as "upside-down" technology. It is necessary in this technology to apply the heat sink as exactly as possible on the laser diode element, namely such that at least in the region of the one resonator mirror of the laser-active zone, namely in the region of that mirror through which the useful laser beam emerges from the laser diode, the heat sink extends at most up to the level of the mirror but, even better, is set back a few $\mu m$. It is thus guaranteed that the useful laser beam emerging divergently from the laser diode does not strike against an edge of the heat sink.

SUMMARY OF THE INVENTION

Particularly for mass production of such single laser diode components, an object of the present invention is to specify a simple technique with which the respective heat sink can be applied in exactly adjusted fashion, and at least without significant added expense for material.

This object is achieved by providing a semiconductor wafer equipped with laser functions. A masking layer covers the semiconductor wafer and has openings which extend down to the wafer. The openings are arranged relative to one another so that parallel rows are formed with adjacent rows being offset by one-half of a diameter of the openings along the row direction so that the openings are offset with respect to one another from row to row. The openings are filled with a thermally conductive material provided for the heat sink action. A surface of the wafer positioned between the rows is scored so as to create parallel scoring lines parallel to the rows of openings. The wafer is then broken so that each row forms an individual ingot along the scoring lines. The individual ingots are then scored along additional scoring lines and are then broken into individual single elements.

The invention has proceeded on the basis of the manufacturing principle of first manufacturing a plurality of laser diode units within a larger wafer and then breaking this wafer in a fundamentally known way into the single components. The scratch method by use of a diamond is empolyed for this breaking. The resulting fracture surfaces are the mirror faces of the individual resonators of the single laser diodes, as is generally known.

The invention is based on the further idea of also already applying the heat sinks to the wafer, and of accomplishing the exact adjustment with the assistance of a preferably re-usable mask. After the manufacture of the overall epitaxial layers built-up of the layer structure of the wafer, and after an electrode coating preferably applied in surface-wide fashion to the corresponding surface of this layer structure, this surface or this electrode coating is covered with a mask, preferably formed of photoresist. In a manner known per se, the photo-resist layer is given a masking structure which corresponds to the intended heat sinks to be applied. This photoresist layer contains an opening for every laser diode provided in the wafer for electrolytic growth of the metal of the heat sink associated with this diode.

As already mentioned above, it is necessary that the applied heat sink be adjusted with a precision of a few $\mu m$ relative to the mirror or to the side face at least in the region of the respective one resonator mirror, i.e. of the one side face of the wafer sections to be produced later by fracturing. Also included in the invention, however, is the further idea, particularly for saving material, to position or distribute these individual openings of the photoresist mask provided for the heat sinks in a favorable way with respect to one another, whereby a distribution offset from row to row and a shape of the contour matched thereto is particularly favorable in accordance with the invention.

After the accomplishment of the electrolytic build-up of the heat sinks of all laser diodes of the wafer, the photoresist layer is removed and the cleaving of the wafer into the individual laser diode chips, is carried out successively in two coordinate directions. In order, given a large number of laser diodes on a single wafer, to also have the path of the fracture occur in adjusted fashion relative to the heat sinks which have already been applied, it is not only a one-time scratching at the outer edge of the wafer which is initiated, but rather a multiple scratching of the wafer surface along the required rated break edge of the wafer proceeding between the heat sinks already applied.

It can be provided in accordance with a further development of the invention that the photoresist mask also be additionally provided with adjustment marks, particularly adjustment openings for the respective emplacement of the scratching diamond. As a consequence of the photo-chemical manufacturing method of the openings of the photoresist mask on the wafer, these adjustment marks can be applied in adjusted fashion with nearly arbitrary precision to the openings provided for the heat sinks. This can be carried out without particular expense or effort.

DESCRIPTION OF THE PREFERRED EMBODIMENTS

Figure 1:
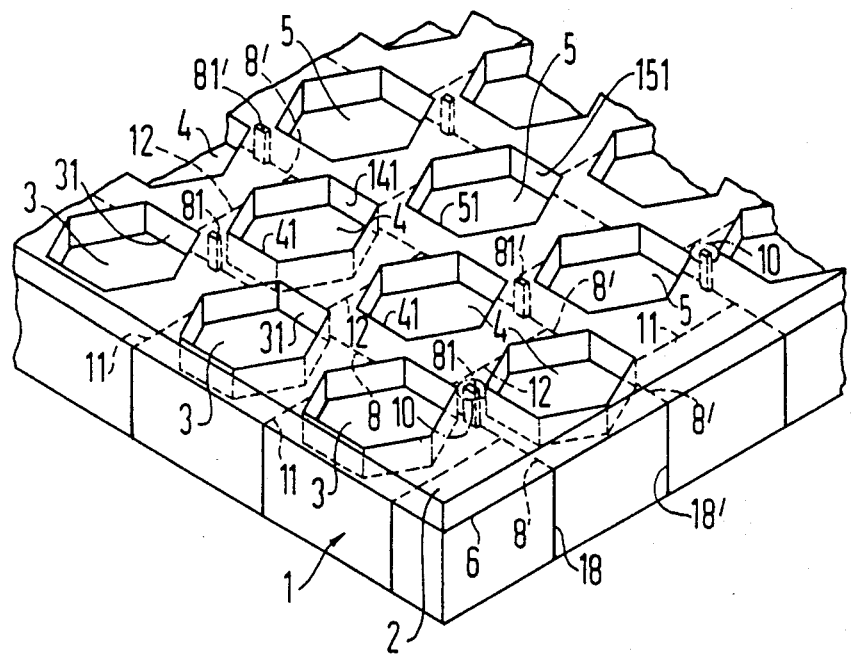
FIG. 1 shows a section of a semiconductor wafer (composed of substrate and an epitaxy semiconductor layer structure lying thereupon) with a photoresist layer arranged on its surface. This photoresist layer already comprises the openings for the heat sinks and (according to a further development) also comprises markings for the scratching.

In FIG. 1, 1 references the semiconductor wafer and 2 references the photoresist layer situated on the surface of the wafer 1. The photoresist layer 2 preferably has a thickness which is at least approximated to the thickness of the individual heat sinks to be produced. Respective openings of the photoresist layer 2 are referenced 3, 4, and 5, these being photolithographically produced and extending down to the wafer surface or down to the electrode coating 6 situated on the wafer surface. The openings 3 form a row; the openings 4 form a second row; and the openings 5 form a further row, whereby the openings 3, 4, and 5 are or can be otherwise identical. The volume of the openings 3, 4, and 5 is subsequently electrolytically filled with metal, whereby this produces the respective heat sink of the individual laser diode which is yet to be separated from the whole wafer. As may also be seen from the illustration of FIG. 1, the openings 3, 4, and 5 are disposed relative to one another. The openings 3 lie tightly next to one another. Still situated between them, however, is a distance such that, during the later fracturing along a straight-line section which proceeds between the heat sinks of two neighboring openings 3, the electrolytically applied material for the heat sinks (otherwise connected to one another) does not have to be divided. End faces of the openings 3 are referenced 31.

End faces of the openings 4 lying opposite the end faces 31, but offset relative thereto, are referenced 41. A fracture edge for the first step in the division of the wafer into individual ingots is provided on straight lines 8 or 8' which proceed between the end faces 31 and 41 (or between 141 and 51). The fracture faces 18, 18' of the wafer corresponding to these fracture lines 8, 8' are mirror faces of individual laser diodes. As is known, the fracture lines 8, 8', (and 7) are placed proceeding along natural cleavage faces of the crystal material of the wafer 1.

It is provided in accordance with the invention that at least the one end face 31 or 41 of the openings 3 or 4 is adjusted such that the fracture line 8 is spaced a spacing of about 0 to 3 μm, and particularly at a distance of about 1 to 2 μm from the provided fracture line 8. At such an end face 31 or 41, the heat sink applied in accordance with the invention has such an exact adjustment that, on the one hand, a maximum cooling effect is (still) also present in the region of the corresponding mirror face of the laser-active zone of the laser diode and, on the other hand, the presence of the front edge of the heat sink of the laser diode corresponding to the end face 31 does not deteriorate the emission of the laser diode through the corresponding mirror face of the fracture face 18 of this laser diode. The analogous situation applies for the adjustment of the edge of the heat sink corresponding to the end face 41 of the opening 4 with respect to, in turn, this fracture line 8. Such an adjustment as described above can also be analogously achieved between opposite (offset) end faces 141 and 51 of openings 4 and 5 in view of the fracture line 8'.

It has already been mentioned above that it is not necessary in a laser diode in all instances that this exact adjustment be met for the respective second mirror face of the optical resonator, that is when laser radiation emerging through this second mirror face is not used as such. Assuming that the surfaces of the individual chips correspond to the end faces 41, then the end face 41 could also end at the fracture line 8 or even project slightly, as long as a projection of the material of the heat sink does not yet negatively influence the exact cleaving of the semiconductor wafer along the prescribed fracture edge.

As may be seen from the illustration of the invention, a (respective) lateral offset of the openings 4 of the one row relative to the openings 3 and 5 of the neighboring rows is provided. This distribution is preferably applied for the entire wafer surface. The offset amounts to half the width of a finished laser diode chip. Since, as may be seen from FIG. 1, the heat sinks (openings 3, 4, and 5 shown in FIG. 1) are also cut off at their diametrically opposite corners, larger clearances seen diagonally result between the individual openings 3, 4, and 5, or between the generated metal members of the heat sinks. Such a larger clearance has been emphasized with 10 at two locations.

The corners of the heat sinks which have been eliminated are not necessary, since they lie outside of the optimum cooling region of the laser diode. These clearances 10, however, are of great significance in the framework of the invention insofar as they provide space for producing individual sections of scratches along the required fracture line 8, 8' between the heat sinks 3 and 4 or 4 and 5 (etc.) arranged offset relative to one another. Given an adjustment of the photoresist mask 2 or its openings 3, 4, and 5 relative to the respective crystal axis direction of the wafer 1 which is not entirely exact, an occasional offset within the crystal planes along the fracture surface 18 can in fact occur. This, however, at most leads to individual laser diodes which are rejects. It is generally guaranteed with these techniques provided in accordance with the invention that the above-indicated, respective exact adjustment of the heat sink relative to the mirrored crystal cleavage face of the chip is guaranteed for the great majority of individual laser diode chips which are produced.

Ingots having a linear arrangement of laser diode chips arise with the fracturing along the fracture lines 8, 8'. . . , namely ingots associated with openings 3, with openings 4, or with opening 5. These individual ingots are then separated from one another along the indicated fracture edges 11 and 12. Thus, their adjustment is not a significant matter.

As is known, the scratching of the crystal material for creating the fracture lines 8, 8' (11, 12 . . .) is executed by a corresponding mechanical feed of an apparatus equipped with a scoring diamond. In the invention, however, it can be provided in accordance with a further development of the invention that openings 81, 81' (of which respectively only one is shown for the sake of clarity) are provided in the photoresist layer, together with and adjusted relative to, the openings 3, 4, and 5, these openings 81, 81' being utilized for the later adjustment of the scratch sections of the fracture lines 8, 8'. By means of corresponding techniques, no deposition of the material of the heat sinks 3, 4, 5 ... occurs in these openings (81, 81').

Figure 2:
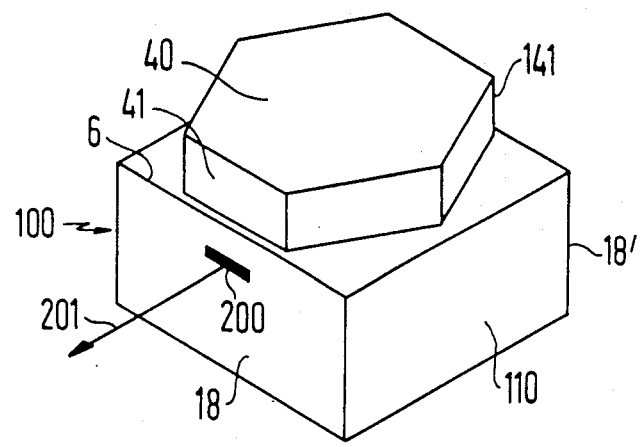
FIG. 2 shows a finished laser diode as a single element.

FIG. 2 shows a single chip 110 of a laser diode 100 as a single component with an applied and adjusted heat sink 40 according to the invention. The remaining reference characters relate to the fact that this laser diode 100 is manufactured from an ingot whose heat sinks had been produced with the openings 4. 200 indicates an exit region of laser radiation 201 generated in the diode 100.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for manufacturing a plurality of laser diodes, each of which has an integrated heat sink wherein each heat sink comprises a body of material having good thermal conductivity applied to a semiconductor body of the laser diode close to a laser-active zone, each individual laser diode having resonator mirrors, comprising the steps of:

providing a semiconductor wafer having laser functions necessary for the single laser diodes;

covering a surface of the semiconductor wafer with a masking layer;

providing openings in the masking layer which extend down to the surface of the wafer, the openings having opposite parallel end faces and being arranged in parallel rows, and adjacent rows being offset relative to one another by an amount equal to approximately half of a dimension of an individual hole in a direction along the row so that openings in adjacent rows are offset relative to one another;

filling the openings with thermally conductive material for the heat sink;

scoring a surface of the wafer parallel to and near the end faces to provide fracture lines between adjacent rows;

breaking the wafer into individual ignots along the fracture lines so as to form fracture surfaces at which said mirror faces of said individual diodes are thus provided; and breaking the individual ingots along previously applied scoring lines between individual laser diodes in each of the ingots to provide the indivdual laser diodes, each of which have an integrated heat sink.

2. A method according to claim 1 including the steps of: providing additional openings in the mask; employing these additional openings for the adjustment of individual scoring locations of the fracture lines which create the ingots; and positioning these additional openings in surface regions of the mask which have been kept free of mutally offset, opposite opening end faces.

3. A method according to claim 1 including the step of applying an electrode layer to the surface of the wafer between the mask and the surface of the wafer.

4. A method according to claim 1 including the step of electrolytically growing the thermally conductive material of the heat sinks in the openings of the mask.

5. A method according to claim 1 including the step of removing the material of the mask from the surface of the wafer before the scoring of the fracture lines parallel to the rows.

6. A method according to claim 1 including the step of employing photoresist as material for the mask.

7. A method according to claim 2 including the step of employing the additional openings of the mask as a guidance during emplacement of a scoring diamond.

8. A method for manufacturing a plurality of laser diodes, each of which have an integrated heat sink, said heat sink being a body of material having good thermal conductivity which is applied to a semiconductor body close to a laser-active zone and having at least one end face parallel and close to a resonator mirror of each diode, comprising the steps of:

providing a semiconductor wafer having laser functions necessary for the single laser diodes;

covering a surface of the semiconductor wafer with a masking layer and providing openings with at least one end face therein extending down to the wafer the openings in the mask being arranged relative to one another so as to form parallel rows, openings in adjacent rows being offset relative to one another in a direction parallel to the rows;

filling the openings with thermally conductive material for the heat sink and so as to create said at least one end face of the heat sink;

scoring the wafer so as to create fracture lines substantially parallel to and between adjacent rows, and the fracture lines being parallel to and spaced from said at least one end face by 0 to 3 $\mu$m so as to improve heat sink action by the heat sink at a face of a finished laser diode while not interfering with emitted radiation;

breaking the wafer into individual ingots corresponding to each row along the fracture lines; and breaking each ingot along scoring lines between individual laser diodes to provide the individual laser diodes with associated heat sinks.

9. A method according to claim 8 wherein the fracture lines are spaced from 1 to 2 $\mu$m from said heat sink end face.

* * * * *